United States Patent
Tahara et al.

[11] Patent Number: 5,235,284
[45] Date of Patent: Aug. 10, 1993

[54] PASSIVE SHIM ARRANGEMENT FOR NUCLEAR MAGNETIC RESONANCE

[75] Inventors: Yasuyuki Tahara; Keiichi Ebihara; Naoji Yoshida; Kazuaki Takeuchi, all of Ako, Japan

[73] Assignee: Mitsubishi Denki Kabushiki Kaisha, Tokyo, Japan

[21] Appl. No.: 972,715

[22] Filed: Nov. 6, 1992

Related U.S. Application Data

[63] Continuation of Ser. No. 546,762, Jul. 2, 1990, abandoned.

[30] Foreign Application Priority Data

Jul. 7, 1989 [JP] Japan ................ 1-174171

[51] Int. Cl.$^5$ ............................................. G01R 33/20
[52] U.S. Cl. ............................................ 324/320; 324/318
[58] Field of Search ............... 324/300, 307, 309, 318, 324/319, 320, 322; 128/653.3, 653.5; 335/301

[56] References Cited

U.S. PATENT DOCUMENTS

| | | | |
|---|---|---|---|
| 4,698,611 | 10/1987 | Vermilyea . | |
| 4,743,853 | 5/1988 | Frese | 324/320 |
| 4,748,413 | 5/1988 | Frese et al. | 324/318 |
| 4,803,433 | 2/1989 | McBride | 324/318 |
| 4,816,962 | 3/1989 | Yamada et al. | 361/141 |
| 4,931,759 | 6/1990 | Breneman et al. | 335/301 |
| 4,983,922 | 1/1991 | Tahara . | |
| 5,003,266 | 3/1991 | Palkovich et al. | 324/320 |
| 5,047,720 | 9/1991 | Guy | 324/320 |

FOREIGN PATENT DOCUMENTS

| | | |
|---|---|---|
| 0272411 | 6/1988 | European Pat. Off. . |
| 61-14007 | 1/1986 | Japan . |
| 63-177506 | 7/1988 | Japan . |
| WO08126 | 10/1988 | PCT Int'l Appl. . |
| 2221308 | 1/1990 | United Kingdom . |
| 8805167 | 7/1988 | World Int. Prop. O. . |

Primary Examiner—Michael J. Tokar
Attorney, Agent, or Firm—Leydig, Voit & Mayer

[57] ABSTRACT

A passive shim arrangement for a nuclear magnetic resonance apparatus has a plurality of nonmagnetic tubes disposed at predetermined positions around a common axis. Each tube is parallel to and uniformly distant from the axis. Magnetic shims are inserted into the tubes to correct components of the magnetic field.

13 Claims, 2 Drawing Sheets

PASSIVE SHIM ARRANGEMENT FOR NUCLEAR MAGNETIC RESONANCE

This application is a continuation of application Ser. No. 07/546,762, filed Jul. 2, 1990 now abandoned.

BACKGROUND OF THE INVENTION

This invention relates to a passive shim arrangement for increasing the uniformity of a magnetic field. More particularly but not exclusively, it relates to a passive shim arrangement for use in a nuclear magnetic resonance apparatus.

A nuclear magnetic resonance (NMR) apparatus requires a magnetic field with a high degree of uniformity. The main magnetic field in an NMR apparatus is generated by a cylindrical coil. As the main magnetic field is usually not adequately uniform for the purposes of NMR, it is necessary to employ some correcting device to increase the uniformity. A commonly-used device for correcting a magnetic field is a magnetic member, referred to as a passive shim, which is disposed inside the cylindrical coil. Typically, a plurality of passive shims are secured with a bonding agent to the inner surface of a support cylinder disposed inside the coil.

Presently, there are no quantitative rules on how to best position passive shims inside an NMR apparatus, and the technician who is installing the shims must rely on his own experience and intuition. As a result, the shim configuration often does not maximize the uniformity of the magnetic field, and the characteristics of the field may vary greatly from apparatus to apparatus. In addition, as the passive shims are installed in the NMR apparatus by bonding, they cannot be easily disconnected from the support cylinder, and it is difficult to adjust the positions of the shims.

SUMMARY OF THE INVENTION

Accordingly, it is an object of the present invention to provide a passive shim arrangement which can accurately and predictably correct a magnetic field for nonuniformities.

It is another object of the present invention to provide a passive shim arrangement which is easy to install and adjust.

It is still another object of the present invention to provide a passive shim arrangement which is particularly suitable for use in an NMR apparatus.

It is yet another object of the present invention to provide a passive shim arrangement which can be installed by an unskilled technician.

A shim arrangement according to the present invention includes a plurality of nonmagnetic shim holders which are disposed in a magnetic field at a uniform distance from a common axis and extend parallel to the axis. It also includes a plurality of magnetic shims which are detachably supported by the shim holders parallel to the axis. The positions of the shim holders with respect to the common axis are mathematically determined so that when shims having appropriate dimensions are inserted into the shim holders, prescribed components of a magnetic field can be accurately corrected. The shim holders need not have any particular shape and can be any members which can support the shims, such as channels, shelves, brackets, etc. In a preferred embodiment, the shim holders are in the form of nonmagnetic tubes into which the shims can be axially inserted.

Because the shims are detachably supported by the shim holders, the positions of the shims can be easily adjusted. Furthermore, because the positions of the shim holders are determined in advance, a technician who installs the shims need not lengthy experience and can simply mount shims of the appropriate dimensions on suitable ones of the shim holders in accordance with the component of the magnetic field which is to be corrected.

When the present invention is employed in an NMR apparatus, the shim holders can be mounted on the inner surface of a support cylinder parallel to the axis of the cylinder in a main magnetic field which is to be corrected.

DESCRIPTION OF THE PREFERRED EMBODIMENT

Figure 1:
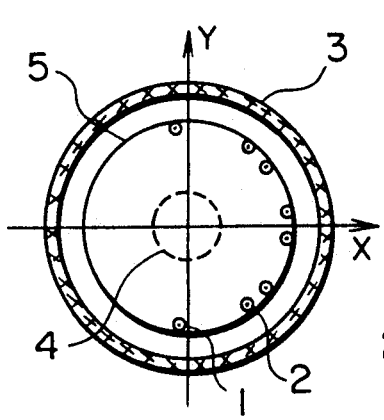
FIG. 1 is a transverse cross-sectional view of an embodiment of the present invention as applied to an NMR apparatus.
Figure 2:
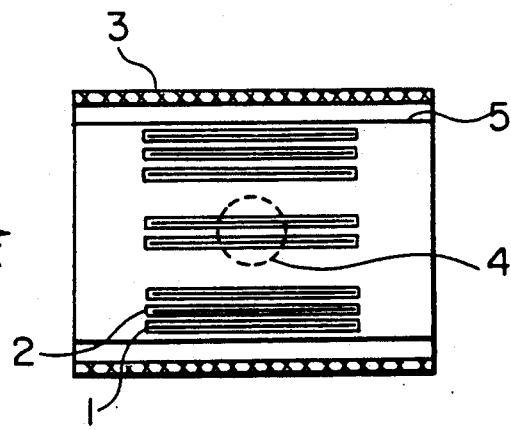
FIG. 2 is a longitudinal cross-sectional view of the embodiment of FIG. 1.

A number of preferred embodiments of a passive shim arrangement according to the present invention will now be described while referring to the accompanying drawings. FIGS. 1 and 2 are respectively a transverse cross-sectional view and a longitudinal cross-sectional view of a portion of an NMR apparatus to which a first embodiment is applied. As shown in these figures, the NMR apparatus includes a cylindrical coil 3 which generates a main magnetic field. A support cylinder 5 is coaxially disposed inside the coil 3, and a plurality of nonmagnetic shim holders in the form of hollow tubes 1 are secured to the inner wall of the support cylinder 5 in prescribed locations. Passive shims 2 in the form of magnetic rods or bars are inserted into the tubes 1. The diameter of the tubes 1 is large enough that the shims 2 can be easily inserted and removed. The length of the tubes 1 is not critical, and they need only be long enough to stably support the shims 2. However, as described below, the present invention may employ a plurality of shims of different lengths. In this case, it is convenient if each tube 1 has substantially the same length as the shim which it is intended to house, so that a technician installing the shims 2 can immediately tell whether he is inserting a shim into the proper tube 1.

The passive shims 2 compensate for nonuniformities in the main magnetic field generated by the coil 3 so that a highly uniform magnetic field can be achieved in a prescribed region 4 at the center of the coil 3. The manner of selecting the dimensions and positions of the shims 2 so as to obtain a uniform magnetic field will be explained while referring to FIGS. 3 and 4, which respectively are a schematic end view and a schematic side view of a single shim 2. In both figures, the position of the shim 2 is shown in both spherical and Cartesian coordinates. In these figures, the z axis corresponds to the longitudinal axis of the cylindrical coil 3, and the x and y axes are orthogonal to the z axis. P is a point of interest within the uniform region 4 at a distance r from the origin, an angle $\phi$ from the x axis, and an angle $\Theta$ from the z axis. $\psi$ is the angle from the x axis to the shim 2 and will be referred to as the installation angle. As shown in FIG. 4, the shim 2 is symmetrically disposed with respect to the plane containing the x and y axes. $\alpha 1$ and $\alpha 2$ are the angles from the z axis to the two end surfaces of the shim 2 and will be referred to as the end surface angles. Each end surface has a cross-sectional area of S. The distance from the x axis to the shim 2 is a.

The component Bz parallel to the z axis of the magnetic field generated by the shim 2 at point P is given by the following equation.

$$Bz = \qquad (1)$$

$$-K \frac{1}{a^2} S \sum_{n=0}^{\infty} \sum_{m=0}^{n} \epsilon_m \frac{(n-m+1)}{(n+m)} [P_{n+1}^m (\cos\alpha)\sin^{n+2}\alpha]_{\alpha 1}^{\alpha 2} \cdot$$

$$\left(\frac{r}{a}\right)^n \cdot P_n^m (\cos\theta) \cdot \cos m(\phi - \psi)$$

wherein:

K = a constant determined by the magnetic properties of the shim 2, $\epsilon$ = Neumann coefficient: $\epsilon = 2$ when $m \neq 0$ and $\epsilon = 1$ when $m = 0$, and $P_n^m$ = nth degree mth order Legendre polynomial.

Equation 1 uses spherical coordinates. This equation can be converted into one using Cartesian coordinates x, y, and z as shown in the following table.

TABLE 1

| | (up to n = 2) | |
|---|---|---|
| n | m | Component in cartesian coordinate system |
| 1 | 0 | z |
| 1 | 1 | x or y |
| 2 | 0 | $z^2$ |
| 2 | 1 | zx or zy |
| 2 | 2 | $x^2 - y^2$ or xy |

The z-direction component Bcz of the magnetic field formed at a point x,y,z in region 4 is expressed by the following equation.

$$Bcz = Bo + A_1 x + A_2 y + A_3 zx + A_4 zy + A_5 xy + A_6 (x^2 - y^2) + \qquad (2)$$

Figure 3:
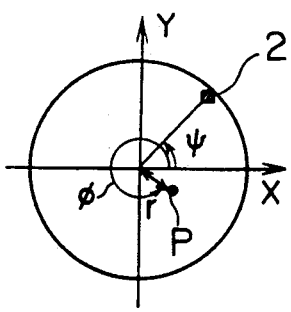
FIG. 3 is a schematic end view of a single passive shim.
Figure 4:
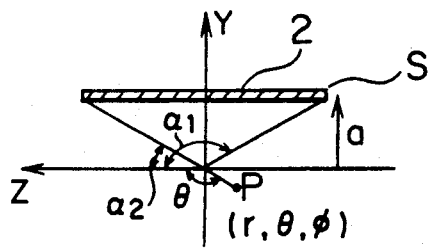
FIG. 4 is a schematic side view of a single passive shim.

Here, Bo is the magnetic field at the origin (0,0,0) in FIGS. 3 and 4. Accordingly, $A_1 x$ is the error component proportional to x.

In order to increase the uniformity of the magnetic field in region 4, it is necessary to choose the location and dimensions of the shims 2 so that the terms in Equation 2 of first order and above are cancelled. As an example, the locations of passive shims 2 for cancelling the first-order term $A_1 x$ in Equation 2 will be described.

As can be seen from Equation 1, the expression for the magnetic field formed by a passive shim 2 has an infinite number of terms. However, generally a>4, so when n is large, terms in Equation 1 which are proportional to $(r/a)^n$ are extremely small and can be ignored. In actual practice, it is only necessary to consider the terms in Equation 1 for which n and m are small. Only the following terms $B^{nm}$ in the expression for the z-axis component of the magnetic field (those for which $m \neq 0$) will be considered:

$B^{11}$, $B^{21}$, $B^{22}$, $B^{31}$, $B^{32}$, $B^{33}$, $B^{41}$, $B^{42}$, $B^{43}$, $B^{44}$, $B^{51}$, $B^{52}$, $B^{53}$, and $B^{54}$.

From Table 1, it can be seen that term $B^{11}$ corresponds to the x component in Cartesian coordinates. The dimensions and positions of passive shims 2 which generate only the term $B^{11}$ are determined as follows. If the installation angle $\psi$ is selected to be $\pi/2 \cdot (\pm \frac{1}{2} \pm \frac{1}{3} \pm \frac{1}{4}) = \pm \pi/24$, $\pm 5\pi/24$, $\pm 7\pi/24$, and $\pm 13\pi/24$, the terms $B^{nm}$ for which m=2, 3, 4 will be zero, so in Equation 1, $\cos m(\Theta - \psi) = 0$. Therefore, the terms $B^{22}$, $B^{32}$, $B^{33}$, $B^{42}$, $B^{43}$, $B^{44}$, $B^{52}$, $B^{53}$, and $B^{54}$ will equal 0, and only the terms $B^{11}$, $B^{21}$, $B^{31}$, $B^{41}$, and $B^{51}$ will remain.

When the end surface angle of one end surface of a passive shim 2 is $\alpha$ and the end surface angle of the other end surface is $(\pi - \alpha)$, i.e., if the passive shim 2 is symmetric with respect to the plane containing the x and y axes for which x=0, then according to Equation 1, $$B^{21} \alpha [P_3^1 (\cos\alpha)\sin^4(\alpha)]_{\pi-\alpha}^{\alpha} = 0$$

$$B^{41} \alpha [P_5^1 (\cos\alpha)\sin^6(\alpha)]_{\pi-\alpha}^{\alpha} = 0$$

Figure 5:
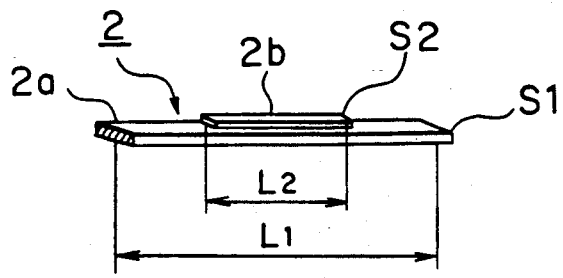
FIG. 5 is a perspective view of a pair of passive shims for use in the present invention.

As a result, the terms $B^{21}$ and $B^{41}$ are equal to zero. Finally, the conditions $B^{51} = 0$ and $B^{31} = 0$ can be satisfied by disposing two shims 2a and 2b adjacent to one another in a single location as shown in FIG. 5 and appropriately choosing the end surface angles $\alpha$ and the ratio of the cross-sectional areas of the end surfaces of the shims 2. The end surface angles $\alpha 1$, $\alpha 2$ for $B^{51}$ to equal 0 are ($\alpha 2 = 33.88°$ and $\alpha 1 = 146.12°$) for the first shim 2a and ($\alpha 2 = 62.04°$ and $\alpha 1 = 117.96°$) for the second shim 2b. If the cross-sectional area of the first shim 2a is S1 and the cross-sectional area of the second shim 2b is S2, then from $$B \sim \alpha S_1 [P_4^1 \cos(33.88°)(\sin 33.88°)^5] + S_2 [P_4^1 \cos(62.04°)(\sin 62.04°)^5] = 0$$

if S1/S2 = 7.16, the $B^{31} = 0$. In the above manner, the end surface angles $\alpha$, the installation angle $\psi$, and the cross-sectional area of the passive shims 2 for cancelling the term proportional to x in the expression for the magnetic field are determined. The lengths of the shims 2a and 2b in FIG. 5 are L1 = 2a/(tan 33.88°) and L2 = 2a/(tan 62.04°).

If pairs of passive shims 2 like those shown in FIG. 5 having lengths L1 and L2 and for which S1/S2 = 7.16 are installed on the support cylinder 5 of FIG. 1 such that $\psi = \pi/2 \cdot (\pm \frac{1}{2} \pm \frac{1}{3} \pm \frac{1}{4})$, a negative output is generated, while if the shims 2 are installed at $\psi = \pi/2 \cdot (\pm \frac{1}{2} \pm \frac{1}{3} \pm \frac{1}{4}) + \pi$, a positive output is generated. Furthermore, as can be seen from Equation 1, the magnitude of the magnetic field generated by the shim 2 can be adjusted by varying the cross-sectional areas S1 and S2 of the shims. Therefore, by suitably selecting the installation angles the cross-sectional areas of the shims, the term $A_1 x$ in Equation 2 can be cancelled.

Since it is not possible to change the cross-sectional area of a single shim, in actual practice, a plurality of different pairs of shims are prepared, the lengths of the first and second shins being the same values L1 and L2 for each pair and the ratio of the areas S1/S2 being 7.16 for each pair but with the magnitudes of the cross-sectional areas varying among the pairs. The technician installing the shims can then select pairs of shims having suitable cross-sections in accordance with the magnitude of the term $A_1x$ to be cancelled.

The positions and dimensions of passive shims for correcting the terms in Equation 2 proportional to y, zx, zy, xy, and $x^2-y^2$ can be determined in the similar manner as with respect to the component which is proportional to x. The positions and dimensions of shims for correcting the various components are given in the following table.

TABLE 2

| Component | Ratio of Areas S1/S2 | End Surface Angles (deg) | Installation Angle (rad) |
|---|---|---|---|
| x | 7.16 | 33.88°, 146.12° (S1) | $\pi/2 (\pm \frac{1}{2} \pm \frac{1}{4} \pm \frac{1}{8})$ |
|   |      | 62.04°, 117.96° (S2) | $\pi/2 (\pm \frac{1}{2} \pm \frac{1}{4} \pm \frac{1}{8}) + \pi$ |
| y | 7.16 | 33.88°, 146.12° (S1) | $\pi/2 (\pm \frac{1}{2} \pm \frac{1}{4} \pm \frac{1}{8}) + \pi/2$ |
|   |      | 62.04°, 117.96° (S2) | $\pi/2 (\pm \frac{1}{2} \pm \frac{1}{4} \pm \frac{1}{8}) + 3\pi/2$ |
| zx | 1.25 | 40.09°, 106.57° (S1) | $\pi/2 (\pm \frac{1}{2} \pm \frac{1}{4} \pm \frac{1}{8})$ |
|    |      | 40.09°, 73.43° (S2)  | $\pi/2 (\pm \frac{1}{2} \pm \frac{1}{4} \pm \frac{1}{8}) + \pi$ |
| zy | 1.25 | 40.09°, 106.57° (S1) | $\pi/2 (\pm \frac{1}{2} \pm \frac{1}{4} \pm \frac{1}{8}) + \pi/2$ |
|    |      | 40.09°, 73.43° (S2)  | $\pi/2 (\pm \frac{1}{2} \pm \frac{1}{4} \pm \frac{1}{8}) + 3\pi/2$ |
| xy | 5.47 | 39.69°, 140.31° (S1) | $\pi/2 (\pm \frac{1}{2} \pm \frac{1}{4} \pm \frac{1}{8}) + \pi/4$ |
|    |      | 65.11°, 114.39° (S2) | $\pi/2 (\pm \frac{1}{2} \pm \frac{1}{4} \pm \frac{1}{8}) + 3\pi/4$ |
| $x^2-y^2$ | 5.47 | 39.69°, 140.31° (S1) | $\pi/2 (\pm \frac{1}{2} \pm \frac{1}{4} \pm \frac{1}{8})$ |
|           |      | 65.11°, 114.39° (S2) | $\pi/2 (\pm \frac{1}{2} \pm \frac{1}{4} \pm \frac{1}{8}) + \pi/2$ |

As can be seen from Table 2, the shims 2 for cancelling the term proportional to y are identical in shape to the shims 2 for cancelling the term proportional to x and therefore can be used interchangeably. Similarly, the same type of shims 2 can be used to cancel the zx term and the zy term, and the same type of shims 2 can be used to cancel the xy and $x^2-y^2$ terms.

Figure 6:
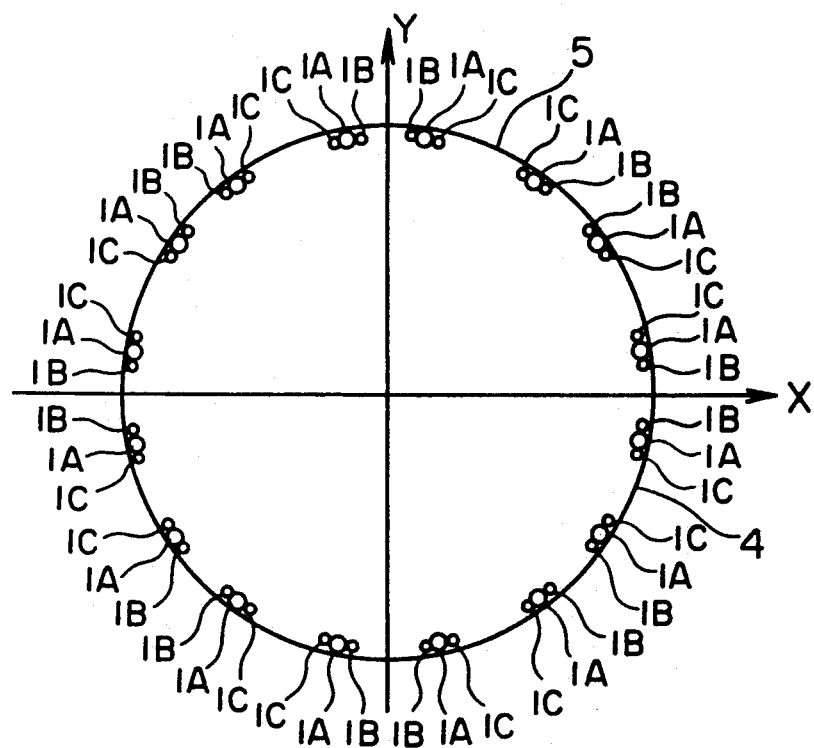
FIG. 6 is a schematic end view showing the positions of shim holders in another embodiment of the present invention.

FIG. 6 is a schematic end view of a second embodiment of a passive shim arrangement according to the present invention. There are 16 different installation angles and three different types of pairs of shims listed in Tables 2, so three different tubes 1A—1C are mounted on the inner surface of a support cylinder 10 at each installation angle for a total of 48 tubes. Tubes 1A are used for housing the shims for cancelling the x and y terms, tubes 1B are used for housing the shims for cancelling the zx and zy terms, and tubes 1C are used for housing the shims for cancelling the xy and $x^2-y^2$ terms in Equation 2. By inserting appropriate shims into tubes at prescribed locations, any of the terms in Equation 2 from $A_1x$ up through $A_6(x^2-y^2)$ can be cancelled.

The dimensions and locations of shims 2 for cancelling the terms in Equation 2 proportional to $x^3$, $y^3$, etc. can be determined in the above-described manner. Furthermore, if nonmagnetic tubes 1 having a prescribed length are installed on the support cylinder 5 at intervals of 60 degrees, 30 degrees, or 15 degrees around its circumference, it is possible to cancel components of the magnetic field proportional to z, $z^2$, $z^3$, etc. by selectively inserting shims 2 having lengths and dimensions calculated in the above manner into the tubes 1.

What is claimed is:

1. A passive shim arrangement for increasing the uniformity of a magnetic field comprising:
   a plurality of nonmagnetic shim holders disposed at a uniform distance from a first axis around a region in which a magnetic field is to be generated, the first axis coinciding with a central axis of the magnetic field; and
   a plurality of pairs of magnetic shims, each pair of magnetic shims being detachably installable on one of the shim holders parallel to the first axis, each pair of shims comprising a first magnetic shim and a second magnetic shim disposed adjacent to and overlapping the first magnetic shim, the first and second magnetic shims having different dimensions.

2. A passive shim arrangement as claimed in claim 1, comprising a support cylinder coaxial with the first axis, wherein each of the shim holders is secured to the support cylinders.

3. A passive shim arrangement as claimed in claim 1, wherein each of the shim holders is a nonmagnetic tube extending parallel to the first axis and sized to receive a pair of shims.

4. A passive shim arrangement as claimed in claim 1, wherein the shim holders are installed at 16 locations about the first axis.

5. A passive shim arrangement as claimed in claim 4, wherein the shim holders are installed at angles of $\pi/2 \cdot (\pm \frac{1}{2} \pm \frac{1}{4} \pm \frac{1}{8})$ and $\pi/2 \cdot (\pm \frac{1}{2} \pm \frac{1}{4} \pm \frac{1}{8}) + \pi$ with respect to a second axis perpendicular and intersecting to the first axis.

6. A passive shim arrangement as claimed in claim 4, wherein a plurality of the shim holders is installed at each of the 16 locations.

7. A passive shim arrangement as claimed in claim 1, wherein each shim has a length and cross-sectional area and including a first group of pairs of shims comprising eight identical pairs of shims, and a second group of pairs of shims comprising eight identical pairs of shims, each pair of shims in the first and second groups comprising a first shim and a second shim disposed adjacent and overlapping the first shim, each of the first shims of the first group of shims having the same length as and a different cross-sectional area from the first shims of the second group of shims, and each of the second shims of the first group of shims having the same length as and a different cross-sectional area from the second shims of the second group of shims.

8. A passive shim arrangement for increasing the uniformity of a magnetic field comprising:
   a support cylinder surrounding a region in which a magnetic field is to be generated, the support cylinder having an axis coinciding with a central axis of the magnetic field;
   a plurality of nonmagnetic shim holders secured to the support cylinder a uniform distance from the axis of the cylinder at angles of $\pi/2 \cdot (\pm \frac{1}{2} \pm \frac{1}{4} \pm \frac{1}{8})$ and $\pi/2 \cdot (\pm \frac{1}{2} \pm \frac{1}{4} \pm \frac{1}{8}) + \pi$ with respect to an axis perpendicular to and intersecting the axis of the cylinder; and
   a plurality of pairs of magnetic shims, each pair of shims being detachably installable on each of the shim holders parallel to the axis of the support cylinder.

9. A passive shim arrangement as claimed in claim 8 wherein each of the shims has a length and each pair of shims comprises a first shim and a second shim having different lengths, the first and second shims in each pair being disposed adjacent each other.

10. A passive shim arrangement as claimed in claim 9, wherein each of the first shims is symmetric with respect to a single plane perpendicular to the axis of the support cylinder.

11. A passive shim arrangement as claimed in claim 1, wherein each of the first shims has a cross-sectional area S1 and each of the second shims has a cross-sectional area S2, each of the first shims has two end surfaces, the end surfaces of each of the first shims being respectively disposed at approximately 33.88° and 146.12° with respect to the first axis, each of the second shims has two end surfaces, the end surfaces of each of the first shims being respectively disposed at approximately 62.04° and 117.96° with respect to the first axis, and S1/S2 is approximately 7.16.

12. A passive shim arrangement as claimed in claim 1, wherein each of the first shims has a cross-sectional area S1 and each of the second shims has a cross-sectional area S2, each of the first shims has two end surfaces, the two end surfaces of each of the first shims being respectively disposed at approximately 40.09° and 106.57° with respect to the first axis, each of the second shims has two end surfaces, the two end surfaces of each of the first shims being respectively disposed at approximately 40.09° and 73.43° with respect to the first axis, and S1/S2 is approximately 1.25.

13. A passive shim arrangement as claimed in claim 1, wherein each of the first shims has a cross-sectional area S1 and each of the second shims has a cross-sectional area S2, each of the first shims having two end surfaces, the two end surfaces of each of the first shims being respectively disposed at approximately 39.69° and 140.31° with respect to the first axis, each of the second shims has two end surfaces respectively disposed at approximately 65.11° and 114.39° with respect to the first axis, and S1/S2 is approximately 5.47.

* * * * *